United States Patent [19]

Lindgren

[11] 3,783,174

[45] Jan. 1, 1974

[54] DOUBLE ISOLATED SHIELDING ENCLOSURE

[76] Inventor: Erik A. Lindgren, 728 Milford St., Evanston, Ill. 60202

[22] Filed: Nov. 15, 1972

[21] Appl. No.: 306,607

[52] U.S. Cl.174/35 MS, 287/20.92 C, 287/20.92 D, 287/189.36 C, 287/189.36 M

[51] Int. Cl. ............................................ H05k 9/00

[58] Field of Search ...................... 174/35 R, 35 MS, 174/35 GC; 287/20.92 R, 20.92 C, 20.92 D, 20.92 Y, 20.92 M, 189.36 C, 189.36 D, 189.36 M

[56] References Cited

UNITED STATES PATENTS

| | | | |
|---|---|---|---|
| 3,040,118 | 6/1962 | Schaller, Jr. | 174/35 MS |
| 3,153,692 | 10/1964 | Lindgren | 174/35 MS |
| 3,322,879 | 5/1967 | Lindgren | 174/35 MS |

OTHER PUBLICATIONS

Lindgren, "Contemporary RF Enclosures," Published by Erik Axel Lindgren, 4517 North Ravenswood, Chicago, Ill. 60640, pp. 93–97, copyright 1967.

*Primary Examiner*—Darrell L. Clay
*Attorney*—Watson D. Harbaugh et al.

[57] ABSTRACT

A double isolated electrically shielded screen room in which all panels are identical and interchangeable for assembly with all overlapping shielding contacts between contiguous shielding members disposed in planes parallel to the respective panels and secured under compression in a direction perpendicular to each panel with great isolation efficiency by outwardly concealed clamping means applied from inside the room assembly so that the floor and space around the room is also economically conserved.

10 Claims, 12 Drawing Figures

PATENTED JAN 1 1974

3,783,174

SHEET 1 OF 3

DOUBLE ISOLATED SHIELDING ENCLOSURE

BACKGROUND OF INVENTION:

Heretofore electrically isolating screen rooms, both single and double have been set up with wasted space around them which was temporarily required by workmen at the time of assembling and securing the screen room panels, plates, joiners, etc., in place from outside the screen rooms. It was not appreciated that this external assembly also amounted in essence to an overall drawing of elements in a direction that inherently would tend to loosen the pressure contact desired between overlapping shielding screen edges. Leakage spaces that might be undetectable could occur that would variably lower the decibel test rating of some rooms otherwise identical. Also difficulty could be experienced with externally installing one or more of the ceiling panels that overlapped the tops of the walls.

SUMMARY OF INVENTION

In the present invention an isolation screen room is provided in which all panels are identical in that the frames are rabbeted one-half of its thickness along all four marginal edges on their inner faces for universal orientation to provide support receving recesses twice as wide as they are deep and thereby also providing marginally extending coplanar flanges having the same dimensions and inwardly bordered by a shoulder of like depth. The recesses receive connector strips that overlap adjacent flanges and also engage the shoulders as assembled and fastened from the inside of the closure.

Isolation electrical shielding covers opposite sides of each panel in two separate units that marginally terminate in coplanar contact flanges marginally isolated in spaced relationship on the recess faces of the flanges. The connector strips that fit in adjacent recesses of two contiguous panels for securement purposes also have isolated shielding elements for separately contacting the margins of the panel shielding units to provide complete continuity of double isolated room shielding.

By way of example, but not limitation, the frames can be 8 feet × 4 feet × 1½ inches and the marginal recesses may be 1½ × ¾ inch and extend the full length of the wide and end edges of the panels. Panels 10 feet × 5 feet × 1½ inches can also be used.

The room assembly is adequately secured solely by clamp bolts extending through the inner screen to engage permanently embedded nuts recessed in the outside surface of the marginal flanges in a position clearly out of contact with the outside screen. Panel flanges abut edge-to-edge when they are disposed coplanar, but lie inside corner-to-corner in dual or triple plane panel joints of a room. They are disposed touching or almost touching. All strips edge-abut against the shoulders of the respective recesses and extend the full width of the bridged flange areas to provide smooth inside walls.

The assembly of the room is particularly advantageous, simple and easy. It is accomplished from inside the screen room thereby enabling substantially full use of any sized building space which is related to an incremental dimension of substantially four feet plus or five feet plus. For instance, panels that comprise 4 × 8 foot units provide a plus overall room size in all three dimensions of 1½ inches since the panel flanges projectively only overlap the recess shoulders at the corners. Accordingly, the next to last ceiling panels to be installed can be shifted sidewise to rest on the vertical end wall shoulders and the last ceiling panel is lifted and moved endwise to pass the tops of the vertical side walls and then dropped into its proper vertical alignment to rest momentarily upon the vertical panel shoulders if angle strips have not yet been installed. Preferably all strips are already applied to the tops of the side walls before the ceiling panel is raised a couple inches and then when dropped into place the strips support the panels from the inside on the vertical panel shoulders and angle strips with the top of the ceiling ultimately disposed three-fourths inch above the level of the upper edges of vertical panels. Thereafter the flat strips are installed between side-adjacent ceiling panels. The bolts when inserted draw the panel edges inwardly in a direction that naturally tightens both pressure-contacting space-isolated screen-overlaps by overall contractive-like forces at the corners. Moreover, the corner arrangement is self-standing one for vertical panels while the bolts are being applied.

DESCRIPTION OF PREFERRED EMBODIMENT

In describing the preferred embodiment, it is to be noted that the panels and strips are constructed and arranged so that any side of the double isolated screen room 10 can serve as a floor, and, any panels 12 to be used as floor panels can be reinforced for weight bearing, if desired. Accordingly, although elements herein are identified as vertical with a V or horizontal with an H for ready understanding and identification of members in the following description, it is their relative position that is significant and not their terrestrial orientation.

Also, line filters and electrical isolation ventilators may be provided (not shown) in the walls of side panels, and an access door for the interior is represented at 14 although not further illustrated. Such a door can be that shown in Lindgren U.S. Pat. Nos. 3,009,984 or 3,256,384 if a sliding door is desired. Moreover, the shielding material may be either close mesh screen or 24 gauge sheet metal and the panels may be sound insulated if desired as shown in Lindgren U.S. Pat. No. 3,322,879.

Figures 1, 2, 3:
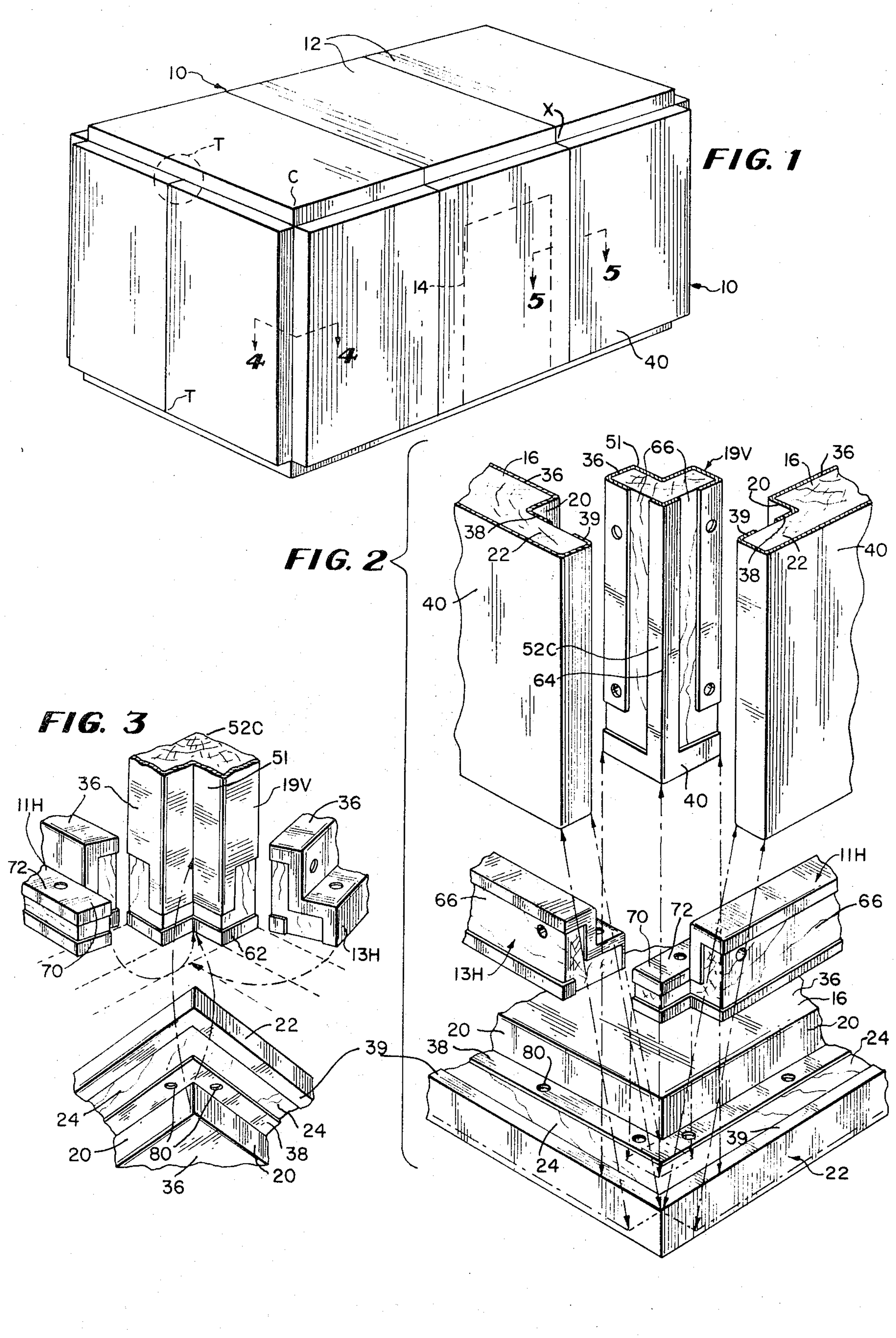
FIG. 1 is a view in perspective illustrating an electrically isolated room in assembled condition.
FIG. 2 is an exploded view of the room shown in FIG. 1 of any triple plane corner, but oriented in relationship to the lower nearest corner of FIG. 1 as viewed from the outside and including the end views of the horizontal angle strips.
FIG. 3 is an unfolded inside, partially exploded view of the corner strips employed in securing the panels together in FIG. 1 at the triple plane corners.

The room 10 is made up of panels 12 having frames 16; vertical flat strips 17V and 18V (FIGS. 6V and 7V); vertical corner angle strips 19V (FIGS. 4 and 4V); horizontal flat strips 15H (FIGS. 5, 5H and 6H); and horizontal corner angle strips 11H and 13H (FIGS. 2 and 3).

Panels 12. The prefabricated panel members 12 have identical frames 16. Each carries on opposite sides thereof isolated sheets of shielding (FIGS. 4 and 5), the inside shielding 36 and the outside shielding 40.

The frames are preferably made of dressed lumber measuring 6 × 1½ inches, cut to appropriate lengths, and assembled to form panel frames 16 that are 8 feet × 4 feet × 1½ inches with their four marginal edges recessed on one side to a width of 1½ inches and a depth of three-fourths inch, leaving a shoulder 20, and thereby forming a continuous flange 22 therearound that is three-fourths inch thick and 1½ inches wide which provides a flat edge face 23¾ inches wide.

The marginal edges of both sheets 36 and 40 of isolation shielding are each bent at two frame corners and marginally cut to terminate in marginally spaced coplanar resilient pressure flanges 38 and 39 that provide coplanar pressure contact areas on the flange faces 24. The inner shield 36 can be preformed by dies and slipped on the frame to encompass the obtuse (270°) corners 42 as formed to lodge at 44 against the shoulders 20 and then turned outwardly from the right angle corner 46 to provide the flange 38 that rests against the face 24 of the flange 22. The outer shield 40 preferably is formed in place on a fixture brake to encompass the obtuse corners 48 and 50 of the flange 22 and terminate in the flanges 39 a spaced distance from flanges 38. Thus, each panel has major dimensions in both cross directions, namely, 4 feet and 8 feet between edge faces 23, which includes the flanges 22, and large and small minor dimensions from shoulders to shoulders 20 in cross directions.

Various materials are known to possess shielding characteristics which serve the purpose of isolating a space against electrical magnetic and electrostatic wave penetrations. The material of shields 36 and 40 may be of any such copper plate, stainless steel plates, etc., all of which have been considered to be effective shielding materials. Further, it has been found that a laminated structure which utilizes a thin layer of a suitable metal bonded to a flexible fibrous material also provides many desirable characteristics as a shielding material. It is to be understood that any of the effective shielding materials may be utilized on the prefabricated panels of this invention and that the illustration in the drawings is of solid material only by way of example.

Vertical Flat Strips 17V and 18V. All of the vertical strips 17V and 18V are of uniform dimension of 3 × ¾ inch throughout their length and are characterized by a narrow width of outside shielding 52 centrally down the center of their exterior face portion 54, branching like a T at opposite ends with the head of the T defining a right angle strip portion 56 on the outside end corner 57 and on opposite sides of the outside end edge at 58. The inside shielding 51 covers the remainder of the strips except they terminate in edges 53 from the edges 59 of the outside shielding.

Figures 6, 7:
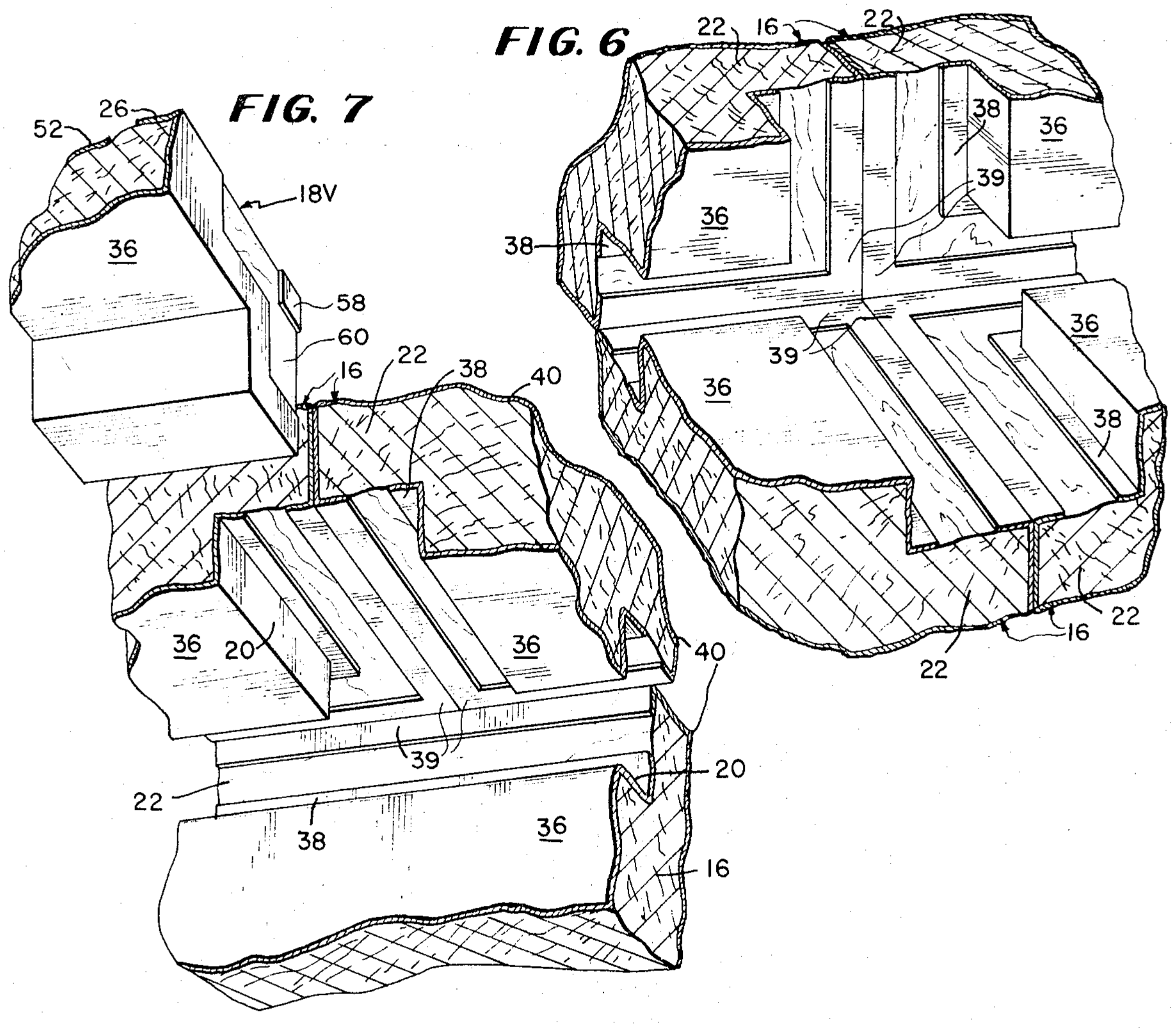
FIG. 6 is an inside view of the orientation of four panels at a dual plane corner.
FIG. 7 is an inside view of the orientation of three panels at a dual plane corner which is identified at T in FIG. 1 at the end of the room where two coplanar panel ends abut a panel side.
Figure 7V:
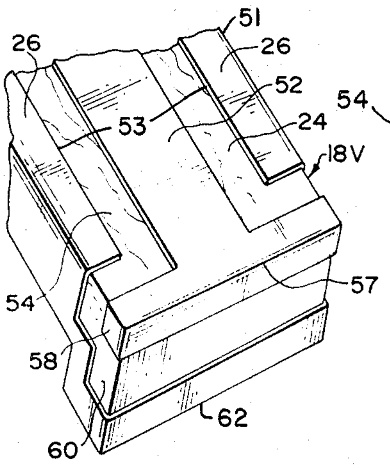
FIG. 7V is a perspective end view of a modification of the strip shown in FIG. 6V having a toe portion that is end abutted by horizontal angle strips.

The vertical flat strips are of a length equal to the longest major panel dimension (8 inches) and fit in contiguous recesses against the faces 24 of edge-abutting coplanar flanges to overlap their joint between edges 23. The ends of each strip are identical for non critical assembly end orientation. Where the strip 18V is part of a dual plane T-joint (FIG. 1) the ends include a toe member 60 (FIG. 7V). The others are used for dual plane, four panel X corner joints (FIG. 1).

Vertical corner strips 19V are right angle strips with an outside dimension of 1½ × 1½ inches and are of a length equal to the major panel dimension to fit in contiguous recesses of contiguous corner panels that are disposed at right angles to each other (FIGs. 2, 3 and 4), sometimes referred to as a dual plane, non-abutting, panel joint.

Figures 4, 4V:
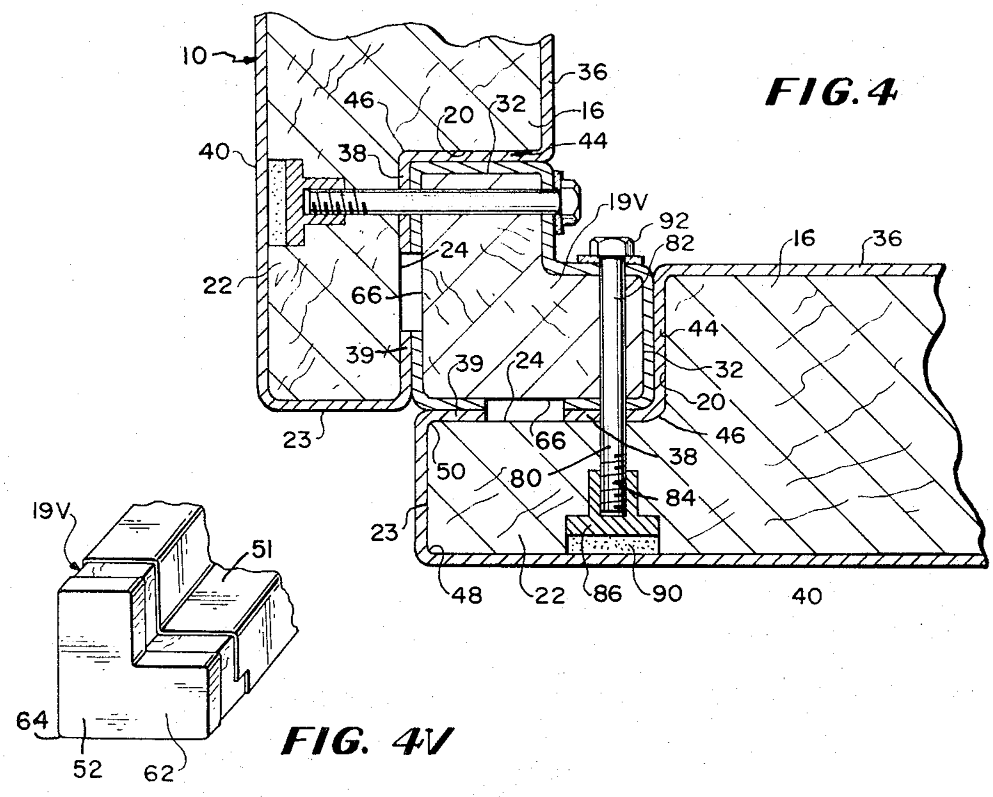
FIG. 4 is a sectional view of a corner taken on line 4—4 of FIG. 1 as representative of all dual plane corners except at the three panel joints.
FIG. 4V is a perspective view of the ends of the vertical corner angle strips shown in FIGS. 2 and 3.
Figure 5:
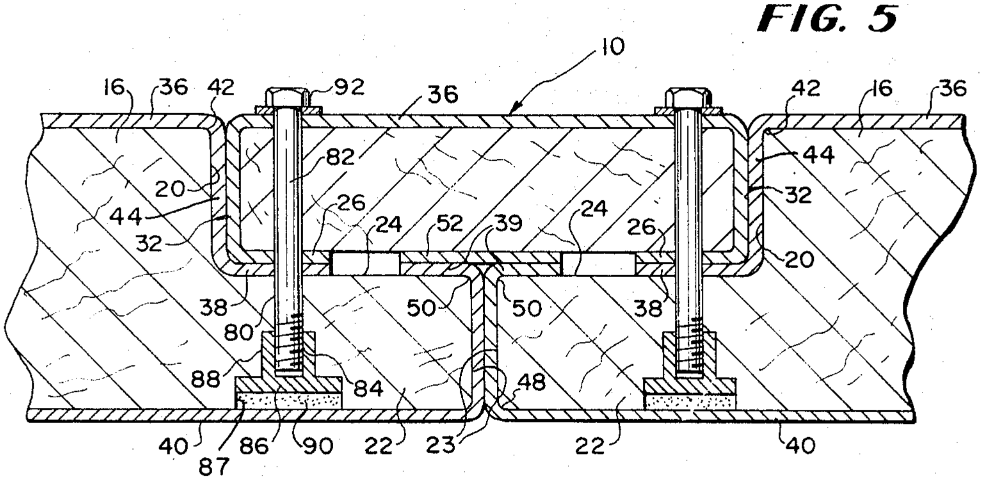
FIG. 5 is a sectional view of a flat strip taken on line 5—5 in FIG. 1 as representative of all coplanar joints between two panels except at the corners.
Figure 5H:
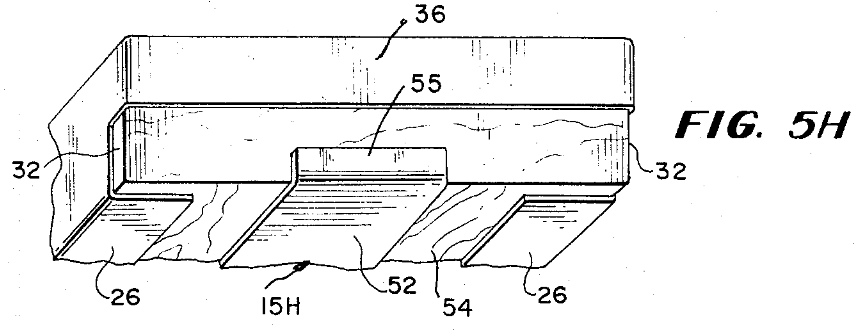
FIG. 5H is a perspective end view of the horizontally disposed flat strips of coplanar panel joints as each strip appears at the dual plane corners as where two pairs of panel ends are involved at a corner joint.

The ends of the vertical corner angle strips 19V are capped with outer shielding material 52 at 62 which engages only the outer shielding flange 39 of the triple plane corner panel joint (FIGS. 2 and 4V). A central section 52C extends between end caps 62 along the obtuse corner 64, joining both end caps, and overlying a marginal edge portion of both faces of the obtuse corner faces 66 to engage the flanges 39 of the dual-plane vertical panels (FIGS. 2 and 3). The remaining area of the angle strips is covered with inside shielding material 51 extending around all remaining corners but marginally terminating in isolated spaced relation with the central section 52C and cap 62.

Horizontal flat strips 15H are received between abutting coplanar panels in both the floor and ceiling. They are shorter than other flat strips by 1½ inches. Otherwise they are substantially identical with the vertical flat strips 17V except that (FIG. 6H) the narrow strip of shielding material 52 running centrally the length of the outer face 54 merely turns over the end corners 57 a limited distance and terminates on the end faces in a tab 55. Like the vertical flat strips 17V the remaining area of the strips are covered with inside shielding 51 whose marginal edges 53 are spaced and isolated from the outside shielding 52.

Horizontal corner strips 11H and 13H are received between dual plane non-abutting panel joints. They are right angle corner strips (1½ × 1½ inches) in two forms 11H and 13H. Corner strip 13H has the length of the lesser of the panel minor dimensions with identical square cut ends. The other form, 11H, has a main body length of the lesser of the minor dimensions with a horizontal flange portion 70 thereof extending beyond the ends of the main body symmetrically at opposite ends and to a distance equal to the width of its flange at 72.

Thus, inventory is essentially reduced to seven elements and three lumber shapes for any size screen room having an incremental dimension of 4 feet: panel, three angle strips and three flat strips.

Securement of Screen Room Parts. (FIGS. 4 and 5) Bolt holes 80 are provided where the bolts 82 preferably pass through or next to the flanges 38 and engage only the inner shield portions 36 and 51 while the threaded end 84 engages the heads 86 of sleeve nuts 88 which prior to the application of the shielding are embedded in the panel flanges 22 at 90 a spaced distance from the frame surface covered by the outside shielding 40 and 52. The nut receiving openings (FIGS. 4 and 5) are mortised and drilled at 87 and preferably receive a square head 86 that is pressed into position with a space between it and the surface of the frame 16 that is then filled with a dielectric wood mastic at 90 that holds the nut in position to receive the bolt end without the nut ever contacting the outside shielding. The heads 92 of the bolts are preferably hex-shaped for wrenching without the end thrust of a screw driver that might bulge the outside shielding if the nut 86 was to be dislodged.

Assembly. The assembly of the room is somewhat self evident from FIGS. 1-5, once it is noted in FIG. 5 that in coplanar panel joints the flanges 22 abut at flat faces 32, while in the dual (FIG. 4) and triple (FIG. 2) plane corner joints of the room the flanges 22 do not abut but are oriented corner-to-corner at 50 and mutually extend laterally beyond the corner 50 of the other a distance that is the thickness of the flanges whereby the overall dimensions include the increments of 4 feet plus 1½ inches which represents the two included flange thickness overhangs of three-fourths inch each.

In the first step of assembly the floor panels can be laid side by side within the space allocated. The horizontal flat and angle strips 11H, 13H and 15H are than added if not already attached when the panels are still on the carpenter's work horses. This is accompanied by squaring and floor leveling techniques, if needed, and fastening all bolts 82 in place to hold the minor dimension-plus length of the horizontal flat strips 15H (FIGS. 5, 5H and 6H) in correct position, i.e. the outer shielding flanges 39 contact the bridging center strip 52, and the inside shielding flanges 38 contact flanges 26 in a face-to-face partial pressure contact relationship established by the lightly tightened bolt 82 and sleeve nut 88 assemblies. The horizontal angle strips comprise: a) the non-symmetrical strips 11H that are disposed along the sides of the panels at the ends of the floor. These strips are spread towards the ends of the floor panels with the longer flange portions 70 engaging and extending equal distances beyond the shoulders 20 thereof (FIGS. 2 and 3). Thereby their adjacent ends are spaced 3 inches at the intermediate mid-joint of the vertical end wall panels of the room to receive the toe portion 60 between them. b) The angle strips 13H, having the shorter minor dimension length, are located coextensive with the end shoulders 20 of the floor panels to end-abut at one end against the terminally exposed longer flange portion 70 of the angle strip 11H and at the other end against the terminally exposed ends of the horizontal flat strips 15H, already described as being in place.

The two coplanar end panels 12 are then set end upright with their bottom shoulders 20 supported upon the end strips 11H with a vertical flat strip 18V secured therebetween having its toe shaped end 60 (FIG. 7) slipping into the three inch space present between the ends of horizontal angle strips 11H. Thereupon vertical corner angle strips 19V preferably already secured to the remote edges of the end panels (FIGS. 2, 4 and 4V) will come into contact by its outside end cap 62 with the outside shielding flanges 39 at the floor panel corner and be secured in place by bolts.

This is repeated for the other end of the floor in which the other end wall of two panels is likewise raised and secured in place. Thus all four vertical corners of the room are erected.

Thereafter the two intermediate room side wall panels can be set in place with horizontal angle strips 13H and the vertical flat strips 17V secured at their edges. This completely encloses the room except for the ceiling and any last panel or doorway whichever is left out temporarily for access until the ceiling is finished.

The ceiling and the floor arrangement of parts are identical. The ceiling is installed by jutting one end edge of each end panel over the top of a side wall panel, raising the other end past the upper shoulders 20 of the opposite side wall panels and retracting the panel enough to drop the flange ends on the upper horizontal angle strips 13H carried on the upper edges of the opposite side wall panels. Thereafter the ceiling panel is moved laterally to rest also on the upper toe portion 60 of flat strip 18V and on the strips 11H located on the upper end wall panels at one end of the room. The other end wall ceiling panel is likewise installed with the bolts secured in loosely threaded engagement.

Figures 6H, 6V:
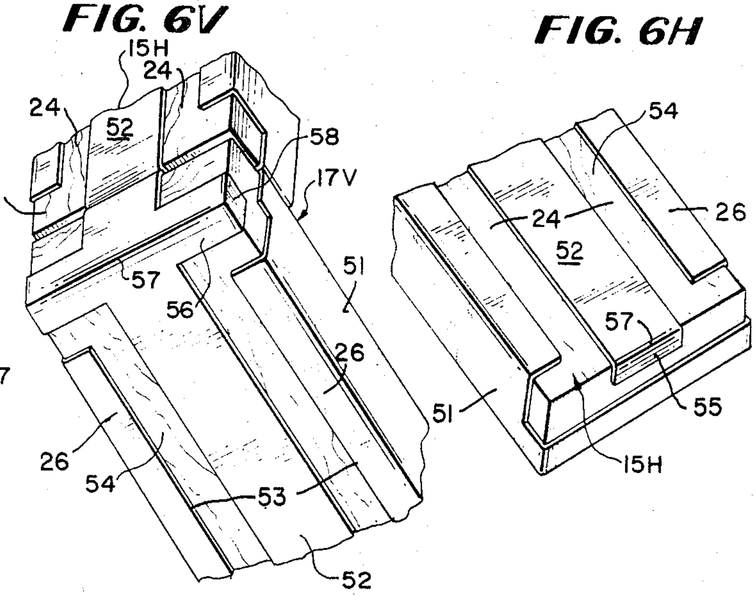
FIG. 6H is a perspective end view of the strip shown in 5H, inverted to show the other side.
FIG. 6V is a perspective end view of the vertical flat strip with the horizontal strip shown coacting therewith at a dual plane corner.

The intermediate ceiling panel remains. It is then inserted endwise between the other ceiling panels and likewise end-jutted over one side wall in one direction between the other two ceiling panels, the other end then raised, and the panel retracted enough to drop into its proper place. Thereupon the two horizontal flat strips 13H are raised and fastened in place in end abutting relationship with the vertical flat strips 17V as shown in FIG. 6V.

Thereafter, the bolts bounding the four central panels of the floor, ceiling and sides are first wrench tightened; then those of the vertical strips 18V at the joint between the two pairs of end panels; then those of the side vertical corners and finally all of thos of the horizontal end forners. Thus, the action of the bolts working on paired coplanar flange contacts in a direction normal thereto operates not only to provide very tight inner and outer electrically shielding contact joints, respectively, but tends to contract the panels inwardly and inherently tighten each corner in a symmetrical pattern on opposite sides of theoretical planes defining included angles of 45° at all dual plane corners.

What is claimed is:

1. In a double isolated electrically shielded screen room, the combination of:

a plurality of panels each characterized by a frame having edges marginally recessed on the same side and facing the same direction a distance wider than it is deep defining a wide face and narrow shoulder disposed at an angle to each other;

shielding covering opposite sides of all of said frames side by side and marginally terminating in pairs of coplanar flanges spaced and electrically isolated from each other on the wide faces of the recesses;

a longitudinally disposed strip interengaging said shoulders of two frames and having a first surface area approximately twice said recess width and an outside shielding element centrally on said surface area bridging the two adjacent single flanges of said pairs of flanges;

an inside shielding element on the remaining surface area of the strip marginally spaced and isolated from said outside shielding element thereon and bridging the remote single flanges of said coplanar pairs; and clamping means normal to said pairs of flanges compressibly clamping the shielding elements against the respective flanges bridged by them.

2. The screen room called for in claim 1 in which said pairs of coplanar flanges are coplanar with each other and said widest faces of the recesses are coplanar with their frames coplanar and abutting to hold said inside shielding elements in contact with each other; and said remaining surface being flat.

3. The screen room called for in claim 1 in which said pairs of coplanar flanges lie in planes perpendicular to one another, and said first surface area comprises two portions disposed normal to each other along an outside corner encased by said outside shielding element.

4. A double isolated screen room comprising:

a plurality of idential panels with peripheral flanges inwardly defining contiguous portions of a recess at each joint and having electrically conductive shielding members on opposite inner and outer sides that terminate marginally in spaced electrically isolated coplanar elements on the recess faces of the flanges;

connector strips disposed in said recesses having electrically isolated shielding portions separately bridging coplanar elements of respective like shielding members at said joints; and elongated securing means interclamping the strips and flanges in a direction normal to their coplanar elements and disposed in contact with one of the isolated shielding portions at one end and spaced at its other end in electrically isolated relationship from the other of the shielding portion and the like shielding members bridged by it.

5. The electrically isolated screen room defined in claim 4 in which said connector strips at said room corners are right angle strips where said panel flanges are disposed at right angles to each other and comprise a central section of an outside shielding portion extending longiitudinally along contiguous marginal edge portions of both faces defining the obtuse corner thereof, and the remaining area of the angle strips is covered with an inside shielding portion extending around the remaining corners of the angle strip and terminating marginally in isolated spaced relation from the outside shielding portion.

6. The electrically isolated screen room defined in claim 5 in which said central section terminates in end caps covering the ends of said strips to contact the outside shielding elements at a corner of a panel the plane of whose flange is parallel with that of the end cap.

7. The electrically isolated screen room defined in claim 5 in which one of said right angle strips at a triple plane room corner has an extension on one side end abutted in part by another right angle strip and both collectively end abut laterally against the end of a third strip disposed normal thereto and having an outside shielding end cap portion contacting the outside shielding elements at a corner of a panel engaged by said one and other angle strips.

8. The electrically isolated screen room defined in claim 5 in which one of said connector strips comprises a flat strip characterized by a narrow width of an outside shielding portion located centrally down the center of the recess face side of the strip and branching at the ends of the strip like a T to define a right angle portion carried on the outside end corner of the strip, said flat strip having an end of double thickness bodily defining a toe portion resting against an intermediate portion of the recess face of a panel flange disposed at right angle thereto at a dual plane room corner, and including two of said right angle strips end-abutting against opposite edges of said toe portion.

9. The electrically isolated screen room defined in claim 6 in which one of said connector strips comprises a flat strip characterized by a narrow width of an outside shielding portion located centrally down the center of the recess face side of the strip and branching at the ends of the strip like a T to define a right angle portion carried on the outside end corner of the strip.

10. The electrically isolated screen room defined in claim 9 in which said strip has an end of double thickness bodily defining a toe portion resting against an intermediate portion of the recess face of a panel flange disposed at a right angle thereto at a dual plane room corner.

* * * * *